United States Patent [19]

Adams, III et al.

[11] Patent Number: 5,808,470
[45] Date of Patent: Sep. 15, 1998

[54] GROUND FAULT DETECTION FOR CATV DEVICES

[75] Inventors: Lewis E. Adams, III, Phoenix; Jeffrey W. Hall, Gilbert, both of Ariz.

[73] Assignee: Intel Corporation, Santa Clara, Calif.

[21] Appl. No.: 719,689

[22] Filed: Sep. 26, 1996

[51] Int. Cl.⁶ .................................................. G01R 31/14
[52] U.S. Cl. ........................ 324/510; 324/509; 324/512; 324/528
[58] Field of Search .............. 324/510; 361/42, 361/46, 47; 307/326

[56] References Cited

U.S. PATENT DOCUMENTS

| | | | |
|---|---|---|---|
| 3,697,808 | 10/1972 | Lee | 361/46 |
| 3,771,098 | 11/1973 | Dempsey | 324/510 |
| 3,783,340 | 1/1974 | Becker | 324/510 |
| 3,798,540 | 3/1974 | Darden | 324/510 |
| 3,963,981 | 6/1976 | Vis | 324/510 |
| 4,028,594 | 6/1977 | Schossow | 307/326 |
| 4,228,475 | 10/1980 | Sherwood | 361/47 |
| 4,413,229 | 11/1983 | Grant | 324/52 |
| 4,415,944 | 11/1983 | Walker | 361/42 |
| 5,105,325 | 4/1992 | Lawrence | 361/42 |
| 5,363,047 | 11/1994 | Dresti | 324/510 |

*Primary Examiner*—Josie Ballato
*Assistant Examiner*—Thomas Valone
*Attorney, Agent, or Firm*—Blakely, Sokoloff, Taylor & Zafman

[57] ABSTRACT

A method for detecting ground faults between a community antenna television (CATV) coaxial cable and an appliance coupled to the CATV coaxial cable for receiving CATV broadcasts is provided. A potential difference between a shield of the coaxial cable and a chassis of the appliance is determined. A fault indicator is provided, if the potential difference exceeds a predetermined threshold voltage. An apparatus for detecting ground faults between an appliance and a CATV coaxial cable is also provided. The apparatus includes a comparator. A first input of the comparator is coupled to a chassis of the appliance. A second input of the comparator is coupled to a shield of the coaxial cable. The comparator indicates a fault condition if a potential difference between the first and second inputs exceeds a predetermined threshold.

17 Claims, 4 Drawing Sheets

GROUND FAULT DETECTION FOR CATV DEVICES

FIELD OF THE INVENTION

This invention relates to the field of consumer electronic product safety. In particular, this invention is drawn to detecting ground faults between a community antenna television (CATV) coaxial cable and a device coupled to the CATV coaxial cable for receiving CATV broadcasts.

BACKGROUND OF THE INVENTION

A number of consumer electronic products use two conductors or two wires to communicate power from a power source to the appliance. Typically an electrical cord having two wires is connected to the appliance at one end and terminates in a two prong plug (one prong for each wire) at the other end. The two prong plug is then plugged into a power source, for example a power outlet or wall outlet. Consumer appliances such as kitchen appliances, televisions, stereos, and other consumer electronics are often "two-wire" appliances.

Other consumer electronic appliances are "three-wire" appliances. These three-wire appliances are connected to a power source, such as that provided by a wall outlet, using three-wires. Two of the three wires are connected between the power source and the appliance as they are for the two-wire appliance. The third wire is provided as a safety feature in order to dissipate an electrical hazard to ground. The third wire is variously referred to as the ground wire or the ground conductor. A computer system, such as that found in a home or office environment, is one example of a three-wire appliance. The chassis and metal enclosures for many three-wire appliances are coupled to the ground conductor in order to protect the consumer in the event that an electrical hazard is communicated to the chassis or the enclosure of the three-wire appliance. Ideally, any electrical hazard impressed upon the chassis or enclosure of a three-wire appliance will be diverted to ground through the ground conductor.

One manner in which an electrical hazard can be communicated to a two-wire or three-wire appliance is through a community antenna television (CATV) coaxial cable. CATV coaxial cables are commonly used to distribute radio frequency (RF) broadcast signals. Generally, any appliance that can be coupled to a CATV coaxial cable is a CATV device. The shield of the coaxial cable is typically connected to the chassis of the CATV device. Thus if the coaxial cable is exposed to an electrical hazard, the coaxial cable shield can communicate the hazard to the chassis of the CATV device. Furthermore, the possibility of exposure to the electrical hazard is increased if the chassis is electrically connected to a conductive enclosure of the CATV device.

A consumer can be exposed to a significant electrical hazard if the enclosure or chassis becomes energized due to an electrical hazard present on the shield of the CATV coaxial cable. For example, the CATV coaxial cable might come into contact with a power transmission line. Alternatively the CATV coaxial cable might be struck by lightning. Moreover, the hazard might be communicated to all CATV devices coupled to the CATV coaxial cable as well as any appliance coupled to any one of the CATV devices.

Electrical codes such as the *National Electrical Code* provide for the grounding of CATV coaxial cables near buildings in order to help minimize exposure to such hazards. (see, e.g., *National Electrical Code,* Art. 820 NFPA 70-1996). Unfortunately the codes do not ensure that the CATV coaxial cable has been grounded near the building or that the grounding is sufficient, especially if the building is a residential building (e.g., a single family dwelling).

Furthermore, although the ground conductor of a three-wire appliance is intended to dissipate electrical hazards, the ground conductor may not be properly or sufficiently grounded. For example, the three-wire appliance may not be plugged in at all (i.e., no ground connection). Alternatively, the three-wire plug may have been plugged into a two-wire socket (i.e., no ground connection) using an adapter plug. In another example, the ground conductor may be inadequately coupled to a ground so that the ground connection fails or is otherwise unable to fully dissipate the hazard.

SUMMARY OF THE INVENTION

In view of limitations of known systems and methods, a method for detecting ground faults between a community antenna television (CATV) coaxial cable and an appliance coupled to the CATV coaxial cable is provided. A potential difference between a shield of the coaxial cable and a chassis of the appliance is determined. A fault indicator is provided, if the potential difference exceeds a predetermined threshold voltage.

An apparatus for detecting ground faults between an appliance and a CATV coaxial cable is also provided. The apparatus includes a comparator. A first input of the comparator is coupled to a chassis of the appliance. A second input of the comparator is coupled to a shield of the coaxial cable. The comparator indicates a fault condition if a potential difference between the first and second inputs exceeds a predetermined threshold.

Other features or advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A community antenna television (CATV) coaxial cable is often used to distribute CATV communications such as radio frequency (RF) broadcast signals. A coaxial cable is a two conductor transmission line. The two conductors include an inner conductor and a shield. The inner conductor is isolated from the shield by insulation. The inner conductor is surrounded by the shield throughout the length of the coaxial cable. The inner conductor is also referred to as the center conductor.

Community antenna television coaxial cable is rated for different types of installations according to fire resistance. These ratings include CATVP, CATVR, CATV, and CATVX. (see, e.g., *National Electrical Code,* Art. 820 NFPA 70-1996). The use of the term "CATV" throughout this description, however, is intended to generically refer to all types of community antenna television coaxial cables and is not intended to be limited to CATV-rated coaxial cables, unless the term "CATV-rated" is explicitly used.

Coaxial cable is also rated according to the information bandwidth that the coaxial cable can communicate. United States industry standard designations for coaxial cables commonly used for the distribution of CATV communications includes RG-6, RG-45, and RG-59 coaxial cables.

The shield of the CATV coaxial cable is usually coupled to a signal ground to help eliminate electrical interference of the signal transmitted on the center conductor. This is typically accomplished by electrically coupling the shield of the CATV cable to some part of a CATV device such as the chassis of the CATV device. If the shield of the CATV cable is exposed to an electrical hazard such as a lightning strike or a power transmission line, the shield can electrically couple the hazard to the chassis of the CATV device. Thus the consumer can be exposed to serious electrical hazards by attaching an appliance to a CATV coaxial cable.

Figure 1:
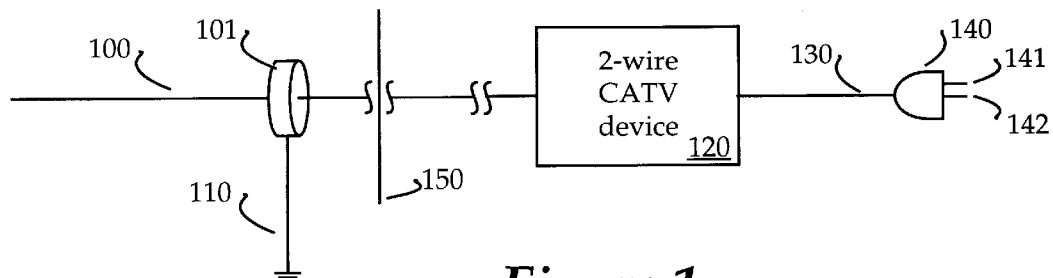
FIG. 1 illustrates a CATV coaxial cable coupled to a two-wire CATV device.

FIG. 1 illustrates a community antenna television (CATV) coaxial cable 100 coupled to a two-wire CATV device 120. (A two-wire appliance that is also a CATV device is referred to as a "two-wire CATV device.") The two-wire CATV device uses a two-wire power cord 130 terminating in a two-prong plug 140. Typically the two-prong plug 140 is plugged into a power outlet (e.g., a wall outlet) so that conductors 141 and 142 can provide power through the power cord 130 to the two-wire appliance.

One model electrical code which establishes standards for CATV systems in the interest of safety is the *National Electrical Code* (NFPA 70-1996). The National Electrical Code is sponsored by the National Fire Protection Association and represents a united effort by various insurance, electrical, architectural, and other allied interests. Although the *National Electrical Code* is only an advisory code, it is often referred to as a standard for use in law and regulatory purposes regarding electrical safety in the interest of life and property protection. (*National Electrical Code,* NFPA 70-1996 cover page, pp. 70-1 thru 70-2).

The *National Electrical Code* provides guidelines for grounding the shield of a CATV coaxial cable at building premises in order to protect against exposure to electrical hazards communicated by the shield of the CATV coaxial cable (see, e.g., *National Electrical Code,* NFPA 70-1996, Art. 820-33). In accordance with electrical codes such as the *National Electrical Code,* a shield 101 of the CATV coaxial cable 100 should be grounded 110 near the entry of the coaxial cable into a building. The building is indicated by barrier 150. As illustrated, shield 101 is exaggerated for purposes of showing its connection to ground 110. Ideally any electrical hazard impressed upon the shield of the CATV coaxial cable 100 will be diverted to ground 110.

Figure 2:
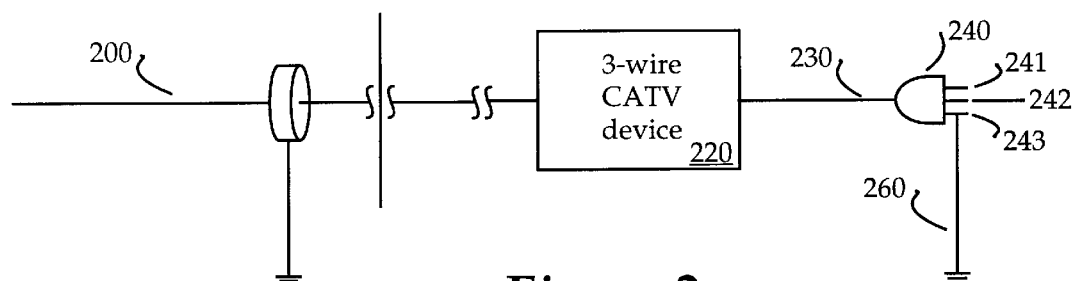
FIG. 2 illustrates a CATV coaxial cable coupled to a three wire CATV device.

FIG. 2 illustrates a CATV coaxial cable 200 coupled to a three-wire CATV device 220. (A three-wire appliance that is also a CATV device is referred to as a "three-wire CATV device.") The three-wire CATV device uses a three-wire power cord 230 terminating in a three-prong plug 240. Typically the three-prong plug 240 is plugged into a power outlet (e.g., a wall outlet) so that conductors 241 and 242 can provide power through the power cord 230 to the three-wire appliance. Power cord 230 includes a ground conductor connected to the ground prong 243 of plug 240. The ground conductor enables grounding the three-wire CATV device 220 through a ground connection 260 when the power cord 230 is plugged into a power source such as a wall socket.

Figure 3:
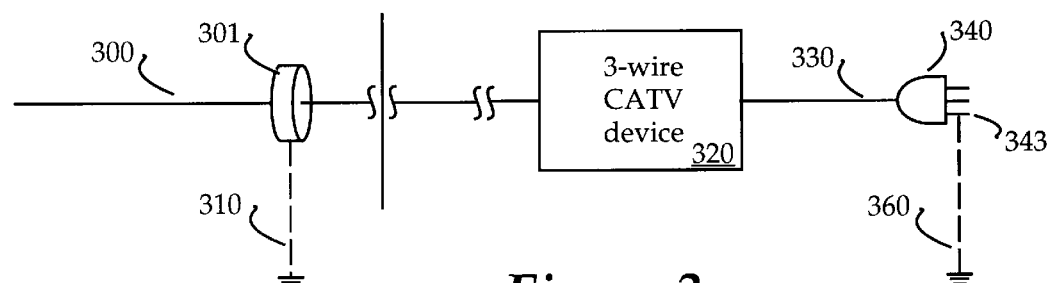
FIG. 3 illustrates CATV coaxial cable coupled to a three wire CATV device without proper grounding.

FIG. 3 illustrates a CATV coaxial cable 300 coupled to a three-wire CATV device 330 without proper or adequate grounding. With respect to shield 301, the lack of proper or adequate grounding is illustrated by dotted line 310. This might occur, for example, if shield 301 of coaxial cable is not grounded at all. Alternatively, the ground connection may not be adequate to carry the current of an electrical hazard such as a lightning strike. Thus shield 301 may be grounded through a grounding connection 310 that will fail or is otherwise unable to dissipate an electrical hazard to ground.

Similarly, the chassis of CATV device 320 might be improperly or inadequately grounded as illustrated by dotted line 360. The chassis is typically connected to ground through the ground conductor of power cord 330. The ground conductor is connected to ground prong 343 of plug 340 for connecting the chassis to ground when the power cord is plugged into a power source. Although the ground conductor of a three-wire appliance is intended to dissipate electrical hazards, the chassis might not be connected to a ground at all. This might occur, for example, if CATV device 320 is unplugged (i.e., the power cord does not connect the chassis to ground). Alternatively, the three-wire plug might be plugged into a wall outlet using a three-prong to two-prong adapter which effectively isolates the ground conductor from any connection to ground. In another example, the ground connection may be inadequate such that the ground connection will fail or is otherwise unable to dissipate an electrical hazard to ground.

CATV devices include consumer electronics such as televisions and videocassette recorders. Some cable companies also provide radio signals on the coaxial cable. Thus, for example, the coaxial cable may provide frequency modulated (FM) radio station transmissions suitable for use by a home radio or stereo system. Thus radios and stereos coupled to CATV coaxial cables are also CATV devices. Televisions, radios, videocassette recorders, and stereo systems are generally two-wire appliances.

Computer systems are another class of consumer electronics which might be coupled to a CATV coaxial cable. Home or office computer systems based upon Intel Corporation (Santa Clara, Calif.) microprocessors are examples of computer systems that can be CATV devices. Examples of such microprocessors include the Intel 80286, 80386, 80486 microprocessors, the Pentium® processor, and the Pentium® Pro processor. Tuner and receiver circuitry that has been integrated onto cards is available for computer systems. These cards can be installed in the computer system in order to provide the capability to receive CATV communications. In one embodiment, the video component of the CATV signal is displayed on a display of the computer system. The audio component of the CATV signal might be played through a speaker system coupled to the computer system.

Computer systems such as those found in a residential and office environments tend to be three-wire appliances. The chassis and metal enclosures for many three-wire appliances are coupled to the ground conductor. Computer systems often include a chassis housed in a metal enclosure. Thus the chassis and the metal enclosure of home computer systems are typically connected to the ground conductor. When a coaxial cable is connected to the computer system, the shield of the cable is grounded to the chassis. Because the enclosure is also coupled to the chassis either directly or through a common ground, any electrical hazard present on the shield of the coaxial cable is communicated to the computer system chassis and enclosure.

A consumer can be exposed to a significant electrical hazard if the enclosure or chassis becomes energized due to an electrical hazard present on the shield of the CATV coaxial cable. For example, the CATV coaxial cable could come into contact with a power transmission line. Another potential hazard is that the CATV coaxial cable might be struck by lightning.

Figure 4:
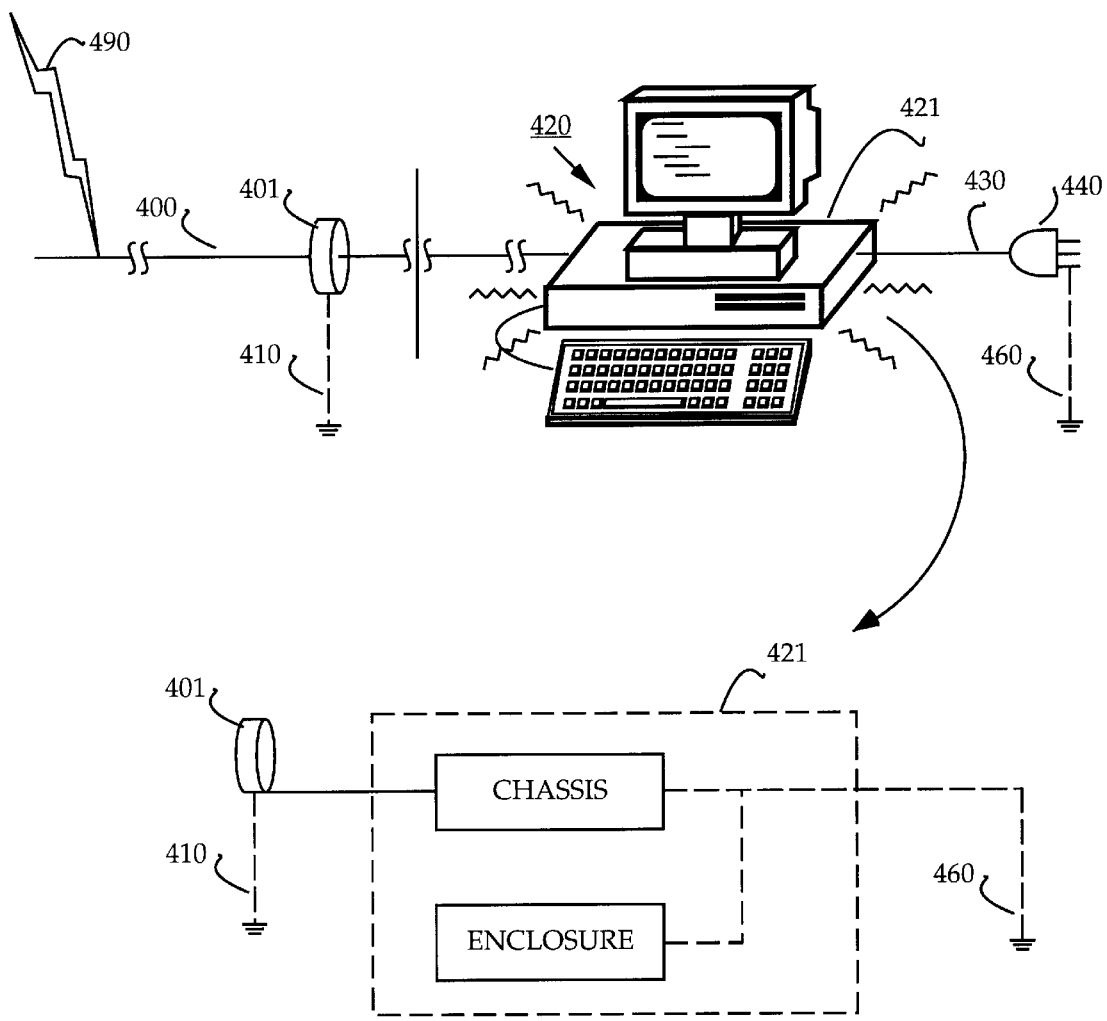
FIG. 4 illustrates exposure of a CATV appliance to an electrical hazard through the shielding of the CATV coaxial cable.

FIG. 4 illustrates how an electrical hazard may be communicated to a three-wire CATV device coupled to a CATV coaxial cable. The shield 401 of the CATV coaxial cable may be exposed to an electrical hazard, for example, by contact with a power transmission line, or perhaps a lightning strike 490. The computer system 420 is illustrated as various components. At least one component, however, is coupled to the CATV coaxial cable for receiving CATV broadcast signals.

In FIG. 4, the shield 401 is connected to a chassis of computer system 420 contained in base component 421. In this embodiment, a base component 421 of the computer system is connected to the CATV coaxial cable 400. In one embodiment, the base component 421 is housed in a metal (i.e., conductive) enclosure. In other embodiments, the base component is housed in a non-conductive enclosure.

The computer system 420 receives power from a three-wire power cord 430. The three-wire power cord terminates in a three-prong plug 440.

Although proper and sufficient grounding might be able to dissipate an electrical hazard communicated to the computer system 420, such grounding may not, in fact, exist.

For example, shield 401 may not be properly or adequately connected to ground as illustrated by dotted line ground connection 410. This could occur, for example, if shield 401 was not grounded at all. Alternatively, the ground may not be adequate to carry the current of a lightning strike 490 so that the ground is destroyed (fails to carry any current) or is otherwise unable to fully dissipate the hazard.

Similarly, the computer system may not be properly or adequately connected to ground as illustrated by dotted line ground connection 460. One example where the computer system is not grounded through power cord 430 is if power cord 430 is unplugged such that there is no electrical path to ground. This might occur, for example, if the computer system was not plugged in to receive power. Alternatively, the three-wire plug may have been plugged into a two-wire socket (i.e., no ground connection) using an adapter plug. In yet another example, the ground conductor may be improperly coupled to a ground such that the ground connection fails before the hazard is fully dissipated.

Thus a chassis of the computer system can be energized by an electrical hazard communicated to the chassis by the CATV coaxial cable. If the chassis resides within a metal enclosure, the metal enclosure is also energized by the electrical hazard as illustrated in FIG. 4.

Although FIG. 4 illustrates a three-wire appliance, the exposure to the electrical hazard can also be significant for two-wire appliances. For example, any exposed conductive part connected to the chassis becomes a safety risk. This might include control buttons, power switches, etc. Furthermore, some two-wire appliances may have a metal enclosure coupled to the shield.

Improper grounding of the coaxial cable or the appliance can thus create a significant safety hazard resulting in damage to the equipment or even fatalities for unwary consumers. In order to detect potential safety hazards due to improper grounding, a ground fault detector (GFD) is used to place a consumer on notice of a potentially hazardous ground fault condition.

Figure 5:
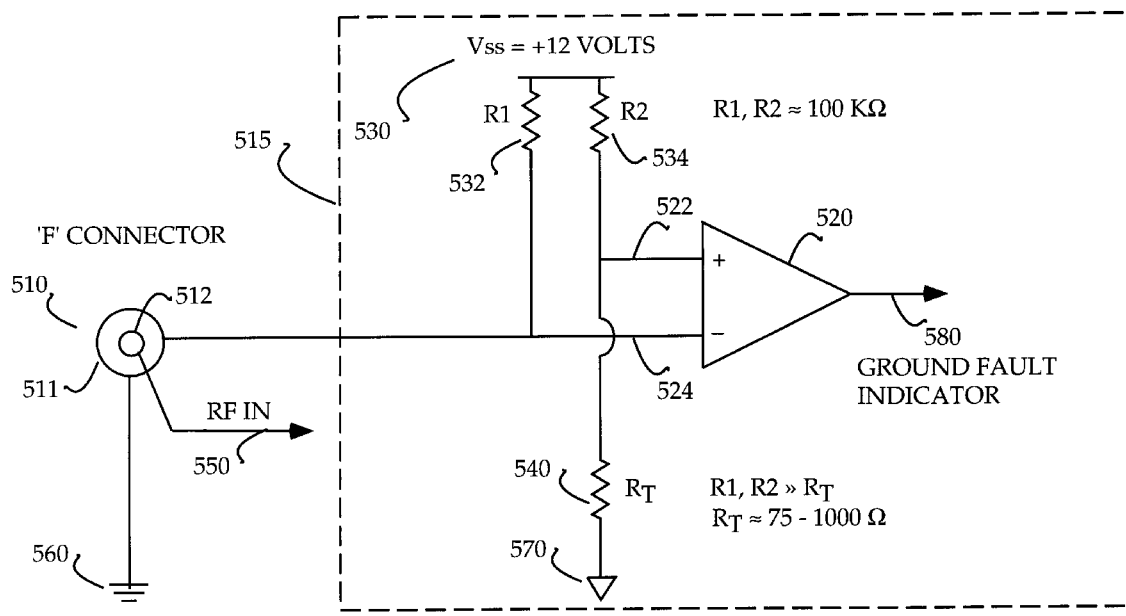
FIG. 5 illustrates one embodiment of a ground fault detector (GFD) for an appliance coupled to an CATV coaxial cable.

FIG. 5 illustrates GFD apparatus 515 for detecting ground faults for an appliance coupled to a CATV coaxial cable. The coaxial cable is typically coupled to the appliance using a connector such as 'F' connector 510. Connector 510 provides a shield connector 511 and a center conductor connector 512. The center connector provides the RF IN signal 550 to the appliance. If the coaxial cable is properly grounded, then shield connector 511 will be grounded to earth ground 560 when connector 510 is connected to the coaxial cable.

GFD 515 detects a potential difference between the coaxial cable shield and the appliance chassis. A ground fault indicator is provided, if the potential difference exceeds a predetermined threshold voltage. Clearly, shield connector 511 must be electrically isolated from the appliance chassis for proper operation.

The shield connector 511 is coupled through resistor 532 (i.e., R1) to a voltage source 530 (i.e., Vss). In one embodiment Vss is approximately 12 volts. Shield connector 511 is also coupled to the inverting input (524) of differential amplifier 520.

The non-inverting input 522 of differential amplifier 520 is coupled through resistor 534 (i.e., R2) to Vss. The non-inverting input 522 is also coupled to the chassis 570 through threshold resistor 540 (i.e., $R_T$).

R1 should have a relatively large resistance so that no appreciable current can flow through the shield of the coaxial cable in the event that the coaxial cable is not properly grounded. R2 and $R_T$ form a voltage divider. As long as the voltage drop across $R_T$ is greater than the potential difference between the shield ground 560 and the chassis ground 570, the differential amplifier will provide an output which approaches the positive power supply rail of the differential amplifier. Using positive logic, this represents a "1."

Alternatively, if the voltage drop across $R_T$ is less than the potential difference between the shield ground 560 and the chassis ground 570, the differential amplifier will provide an output which approaches the negative power supply rail of the differential amplifier. Using positive logic, this represents a "0."

Thus a "1" indicates that the potential difference between the chassis ground and the shield ground is within a predetermined threshold voltage. This implies that the potential difference between the chassis ground and the shield ground is sufficiently small to consider the chassis ground and the shield ground to be connected or the same. Thus a "1" indicates that the shield and the chassis share the same ground.

A "0" indicates that the potential difference between the chassis ground and the shield ground is not within the predetermined threshold voltage. This implies that the potential difference between the chassis ground and the shield ground is sufficiently large to consider the chassis and the shield as having separate grounds. Thus in this embodiment, the logical "0" indicates that a ground fault condition exists.

In various embodiments, the ground fault indicator signal 580 is used to control visible or audible warning indicators to place the consumer on notice of a ground fault condition.

Figure 6:
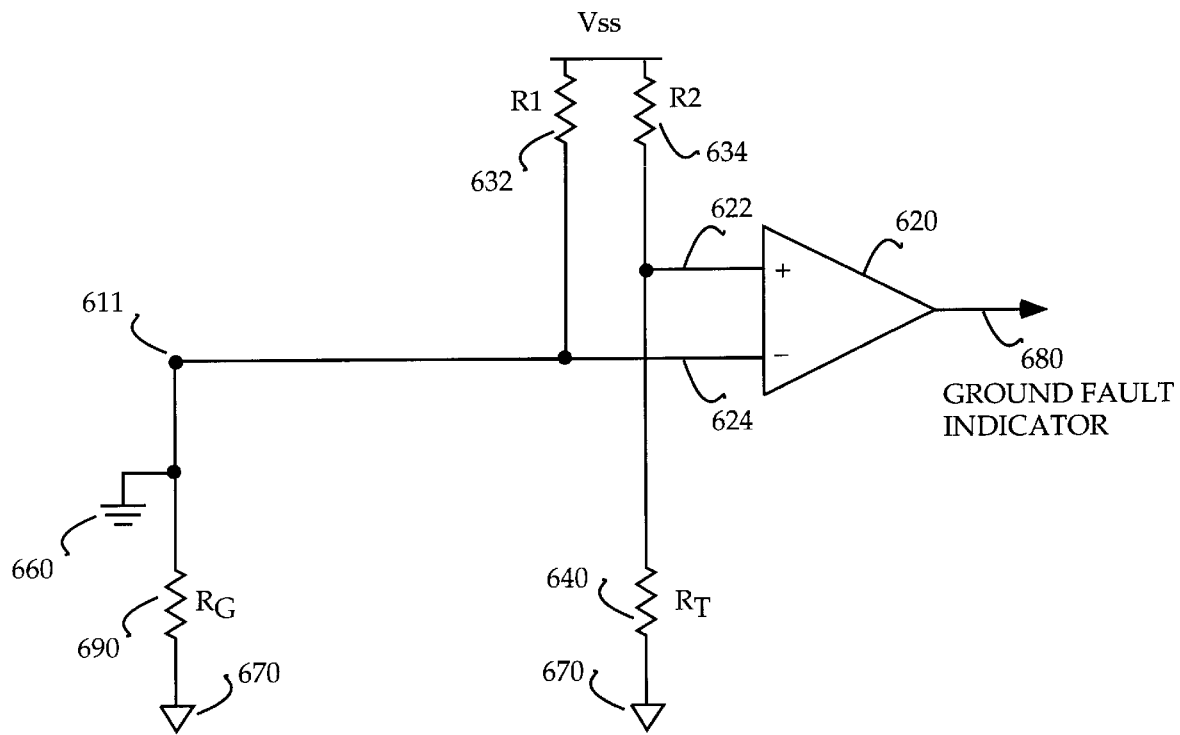
FIG. 6 illustrates a simplified circuit for the analysis of the GFD illustrated in FIG. 5.

FIG. 6 is provided for a better understanding of the operation of the circuit of FIG. 5. The shield connector of FIG. 5 is collapsed into a node 611. The shield may or may not be connected to ground 660, depending upon whether a grounding block or some other device was used to properly ground the coaxial cable. Resistor 690 (i.e., $R_G$) is used to model the resistance between the earth ground 660 and the chassis ground 670. If the chassis ground is not connected to an earth ground then resistor $R_G$ effectively has an infinite (∞) resistance.

R1 and $R_G$ serve as a first voltage divider and R2 and $R_T$ serve as a second voltage divider for differential amplifier 620. The voltage appearing at the non-inverting input 622 of differential amplifier 620 is $$V_{SS}\left(\frac{R_G}{R1+R_G}\right).$$

Similarly the voltage appearing at the inverting input 624 of differential amplifier 620 is $$V_{SS}\left(\frac{R_T}{R2+R_T}\right).$$

Thus differential amplifier 620 provides a "1" as long as $$V_{SS}\left(\frac{R_T}{R2+R_T}\right) - V_{SS}\left(\frac{R_G}{R1+R_G}\right) > 0.$$

Presumably RG is relatively small if the chassis and the shield share the same ground. Eliminating Vss and choosing R1 and R2 to have resistances much greater than that of $R_G$ and $R_T$, respectively, permits simplification of the expression. In this case, the differential amplifier will indicate that the chassis and shield share a same ground as long as $$\frac{R_T}{R2} - \frac{R_G}{R1} > 0.$$

If R1 and R2 are chosen to have substantially the same resistance values, then differential amplifier 620 effectively serves as a comparator to compare the resistance of $R_T$ with $R_G$. In other words, differential amplifier 620 will indicate that the chassis and the shield share a same ground if $R_T > R_G$. Thus $R_T$ effectively serves as the threshold resistance for determining if the chassis and the shield share the same ground.

In one embodiment, resistors R1 and R2 are chosen to have substantially the same resistance value, P. In order to limit potential current flow through R1 and thus through the shield in the event the shield is not properly grounded, P is a substantially high value. P is also substantially greater than (e.g., at least 10 times greater than) the resistance of $R_T$.

Referring back to FIG. 5, in one embodiment, P is chosen to be 100 KΩ so that resistors R1 and R2 are 100 KΩ resistors. $R_T$ should be in the range of 75Ω to 1000Ω. Preferably, $R_T$ is less than 600Ω. Generally, the smaller the value of $R_T$, the better the connection between the shield ground and the chassis ground must be in order for the GFD to provide a logical "1."

The GFD will indicate a ground fault as long as the chassis and the shield of the coaxial cable do not share a same ground. This could occur under a number of circumstances. For example, the coaxial cable may not be grounded. Alternatively, the appliance may not be grounded. Even if the appliance and the coaxial cable are grounded, the embodiment illustrated in FIG. 5 will indicate a ground fault if the coaxial cable is not connected to the 'F' connector of the appliance.

Although the GFD can be used with two-wire appliances, typically only three-wire appliances have a chassis connected to an earth ground. The two-wire appliance and the coaxial cable will not share the same earth ground, even if the coaxial cable is properly grounded. Therefore the GFD will indicate that a ground fault exists for a two-wire appliance, unless the two-wire appliance has the chassis connected to an earth ground. Thus although the GFD accurately indicates that the two-wire appliance and the coaxial cable do not share the same earth ground, this does not mean that the coaxial cable is improperly grounded.

Assuming that three-wire appliances are properly grounded to an earth ground (e.g., through the ground conductor of the power cord), a logical "0" from the GFD indicates that the coaxial cable is likely to be improperly grounded and thus can more easily communicate an electrical hazard to the appliance.

In one embodiment, the ground fault detector device is incorporated within a three-wire CATV device. If the GFD is designed to provide a visual or audible warning to the consumer, a manufacturer can ensure that the consumer is put on notice of a potential safety hazard due to a ground fault condition.

In another embodiment, the GFD is external to the CATV device. This embodiment can be used to check existing CATV devices connected to CATV coaxial cables.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising the steps of:
   a) determining a potential difference between a shield of a community antenna television (CATV) coaxial cable and a chassis of an appliance coupled to the coaxial cable; and
   b) providing a fault indicator, if the potential difference exceeds a predetermined threshold voltage.

2. The method of claim 1 wherein the appliance comprises at least one of a computer system, a television, a radio, and a videocassette recorder.

3. The method of claim 1 wherein the chassis of the appliance is electrically connected to an enclosure of the appliance.

4. The method of claim 1 wherein the ground of the appliance is electrically connected to an enclosure of the appliance.

5. The method of claim 1 wherein the appliance is a three-wire appliance.

6. An apparatus for detecting a ground fault for an appliance coupled to a community antenna television (CATV) coaxial cable, comprising:
   a source voltage coupled to a chassis of the appliance and a shield of the coaxial cable;
   a comparator, wherein a first input of the comparator is coupled to the chassis of the appliance, wherein a second input of the comparator is coupled to the shield of the coaxial cable, wherein the comparator indicates a fault condition if a potential difference of the first and second inputs exceeds a predetermined threshold.

7. The apparatus of claim 6 wherein the appliance comprises at least one of a computer system, a television, a radio, and a videocassette recorder.

8. The apparatus of claim 6 wherein the ground of the appliance is electrically connected to an enclosure of the appliance.

9. The apparatus of claim 6 wherein the chassis of the appliance is electrically connected to an enclosure of the appliance.

10. The apparatus of claim 6 further comprising:
   a first resistor for coupling the source voltage to the first input;
   a second resistor for coupling the source voltage to the shield;
   a threshold resistor coupling the first input to the chassis, wherein a resistance of the threshold resistor is substantially less than a resistance of the first and second resistors, wherein the threshold resistor establishes the predetermined threshold difference corresponding to a connection resistance between the shield and the chassis.

11. The apparatus of claim 10 wherein a resistance of the threshold resistor is in a range of approximately 75 to 1000 ohms.

12. The apparatus of claim 10, wherein the first and second resistors have approximately a same resistance.

13. The apparatus of claim 10, wherein a resistance of the first resistor and a resistance of the second resistor are substantially greater than a resistance of the threshold resistor.

14. The apparatus of claim 13, wherein the resistance of the first resistor and the resistance of the second resistor are at least 10 times the resistance of the threshold resistor.

15. The apparatus of claim 10 wherein a resistance of the threshold resistor is no greater than 600 ohms.

16. A method comprising the steps of:
   a) determining if an impedance measured between a shield of a community antenna television (CATV) coaxial cable and a chassis of a CATV device exceeds a predetermined threshold; and
   b) providing a fault indicator, if the impedance exceeds the predetermined threshold.

17. The method of claim 16 wherein the appliance comprises at least one of a computer system, a television, a radio, and a videocassette recorder.

* * * * *